ized to (12) United States Patent
K et al.

(10) Patent No.: US 10,884,062 B2
(45) Date of Patent: Jan. 5, 2021

(54) DETECTION AND MITIGATION OF RAPID CAPACITY LOSS FOR AGING BATTERIES

(71) Applicant: GM GLOBAL TECHNOLOGY OPERATIONS LLC, Detroit, MI (US)

(72) Inventors: Raghunathan K, Troy, MI (US); Ramona Y. Ying, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 137 days.

(21) Appl. No.: 16/175,286

(22) Filed: Oct. 30, 2018

(65) Prior Publication Data
US 2020/0132777 A1 Apr. 30, 2020

(51) Int. Cl.
*H02J 7/00* (2006.01)
*G01R 31/36* (2020.01)
(Continued)

(52) U.S. Cl.
CPC ....... *G01R 31/3648* (2013.01); *G01R 31/371* (2019.01); *G01R 31/389* (2019.01); *H02J 7/007* (2013.01); *H02J 7/0047* (2013.01)

(58) Field of Classification Search
CPC .. H02J 7/02; H02J 7/007; H02J 7/0045; H02J 7/022; H02J 7/045; H02J 2207/20; H02J 5/00; H02J 7/00045; H02J 7/0013; H02J 7/0022; H02J 7/0024; H02J 7/00714; H02J 7/36; H02J 50/12; H02J 7/025; H02J 7/0047; H02J 7/0027; H02J 50/80; H02J 7/0048; H02J 50/40; H02J 50/50; H02J 5/005; H02J 7/00; H02J 7/0029; H02J 7/00712; H02J 13/0003; H02J 2310/46; H02J 2310/48; H02J 50/005; H02J 50/10;
(Continued)

(56) References Cited
U.S. PATENT DOCUMENTS 6,639,385 B2 10/2003 Verbrugge et al.
7,109,685 B2 9/2006 Tate, Jr. et al.
(Continued)

FOREIGN PATENT DOCUMENTS

CN 111114385 A 5/2020
DE 102019114734 A1 4/2020

*Primary Examiner* — Binh C Tat
(74) *Attorney, Agent, or Firm* — Harness, Dickey & Pierce, P.L.C.

(57) ABSTRACT

A battery control system for a vehicle includes a battery state estimator configured to obtain a battery cell open circuit voltage (OCV) of a battery in response to a charging system charging the battery to a maximum charging voltage. The system includes a negative voltage determination module configured to determine a negative OCV of the battery based on the obtained cell or battery OCV. The system includes a voltage shift determination module configured to identify a difference between the negative OCV of the battery and a previous negative OCV of the battery. The system also includes a charge voltage module configured to selectively reduce the maximum charging voltage to a reduced maximum charging voltage based on the difference and transmit the reduced maximum charging voltage to the charging system. The charging system is instructed to charge the battery such that the battery does not exceed the reduced maximum charging voltage.

18 Claims, 10 Drawing Sheets

(51) Int. Cl.
*G01R 31/371* (2019.01)
*G01R 31/389* (2019.01)

(58) Field of Classification Search
CPC .......... H02J 50/70; H02J 50/90; H02J 7/0042;
H02J 7/0063; H02J 7/0071; H02J
7/007192; H02J 7/027; H02J 2207/40;
H02J 2310/22; H02J 7/00304; H02J
7/00308; H02J 7/005; H02J 7/0068; H02J
7/007182; H02J 7/0077; H02J 7/0091;
H01M 10/4207; H01M 10/441; H01M
2220/30; H01M 2/1022; H01M 10/48;
H02P 29/00; H02M 2001/007; H02M
2001/008; Y02B 70/10; A61B
2017/00084; A61B 2018/00702; A61B
2090/061; A61B 5/068; A61B
2018/00767; A61B 2018/00779; A61B
2018/1226; Y02T 90/12; Y02T 10/72;
B60L 2240/547; B60L 2200/26
USPC .................................. 320/160–167
See application file for complete search history.

(56) References Cited

U.S. PATENT DOCUMENTS

| | | | |
|---|---|---|---|
| 7,324,902 B2 | 1/2008 | Verbrugge et al. | |
| 7,373,264 B2 | 5/2008 | Verbrugge et al. | |
| 7,612,532 B2 | 11/2009 | Verbrugge | |
| 7,768,233 B2 | 8/2010 | Lin et al. | |
| 7,928,690 B2 | 4/2011 | Koch et al. | |
| 8,054,046 B2 | 11/2011 | Lin et al. | |
| 8,108,160 B2 | 1/2012 | Liu et al. | |
| 8,170,818 B2 | 5/2012 | Lin et al. | |
| 8,198,864 B2 | 6/2012 | Koch et al. | |
| 8,212,519 B2 | 7/2012 | Koch et al. | |
| 8,321,164 B2 | 11/2012 | Liu et al. | |
| 8,441,262 B2 | 5/2013 | Minarcin et al. | |
| 8,452,556 B2 | 5/2013 | Zhang et al. | |
| 8,529,125 B2 | 9/2013 | Leutheuser et al. | |
| 8,531,158 B2 | 9/2013 | Wang et al. | |
| 8,560,257 B2 | 10/2013 | Tang et al. | |
| 8,581,543 B2 | 11/2013 | Koch et al. | |
| 8,612,168 B2 | 12/2013 | Zhang et al. | |
| 8,645,088 B2 | 2/2014 | Schaefer et al. | |
| 8,680,815 B2 | 3/2014 | Wang et al. | |
| 8,775,105 B2 | 7/2014 | Lin et al. | |
| 8,836,280 B2 | 9/2014 | Koch et al. | |
| 8,872,519 B2 | 10/2014 | Meisner et al. | |
| 8,936,394 B2 | 1/2015 | Kenkre et al. | |
| 8,994,340 B2 | 3/2015 | Matthe et al. | |
| 9,091,735 B2 | 7/2015 | Wang et al. | |
| 9,172,118 B2 | 10/2015 | Marsh et al. | |
| 9,176,194 B2 | 11/2015 | Meisner et al. | |
| 9,267,995 B2 | 2/2016 | Johnson et al. | |
| 9,267,996 B2 | 2/2016 | Baughman | |
| 9,337,484 B2 | 5/2016 | Verbrugge et al. | |
| 9,354,277 B2 | 5/2016 | Lin et al. | |
| 9,461,485 B2 | 10/2016 | Koch | |
| 9,511,670 B2 | 12/2016 | Conell et al. | |
| 9,575,128 B2 | 2/2017 | Frost et al. | |
| 9,726,732 B2 | 8/2017 | Lin et al. | |
| 2012/0101753 A1 | 4/2012 | Lin et al. | |
| 2012/0109556 A1 | 5/2012 | Syed et al. | |
| 2012/0136595 A1 | 5/2012 | Tang et al. | |
| 2013/0300425 A1* | 11/2013 | Shiraishi | H02J 7/007184 324/426 |
| 2013/0314050 A1* | 11/2013 | Matsubara | H02J 7/00 320/134 |
| 2016/0141905 A1* | 5/2016 | Yamanaka | H01M 8/04395 320/135 |
| 2016/0146895 A1* | 5/2016 | Yazami | H01M 10/486 324/426 |
| 2019/0308630 A1 | 10/2019 | K et al. | |

* cited by examiner

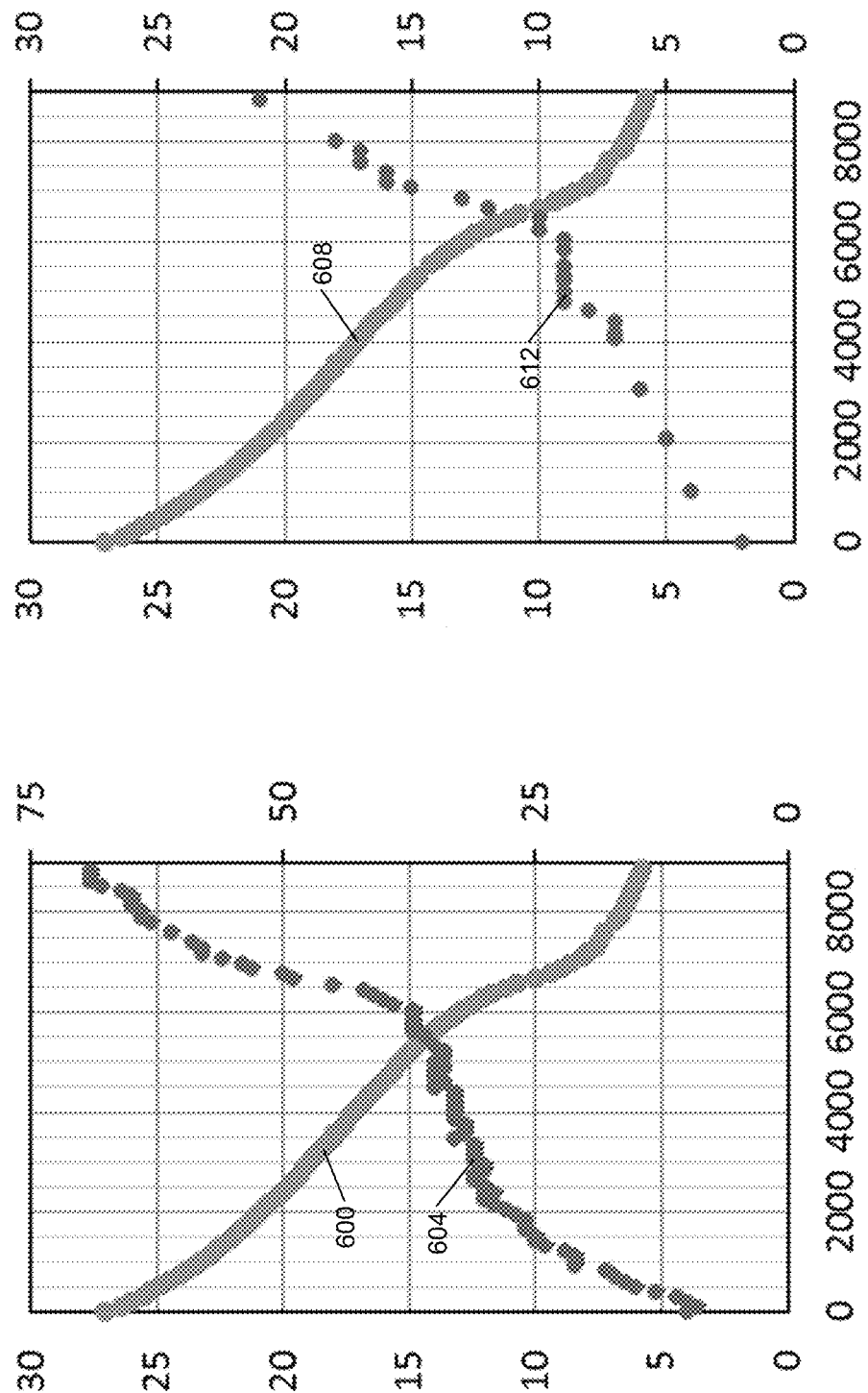

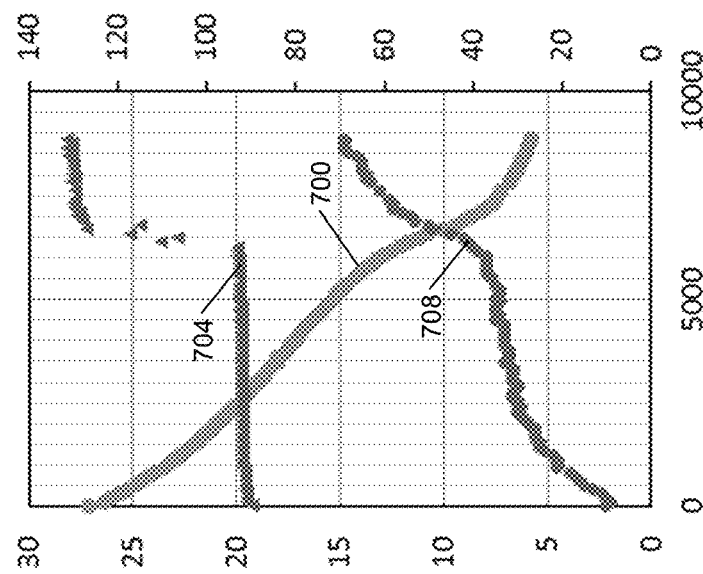

DETECTION AND MITIGATION OF RAPID CAPACITY LOSS FOR AGING BATTERIES

INTRODUCTION

The present disclosure relates to vehicle propulsion systems and more particularly to systems and methods identifying an onset of rapid cell capacity loss of a battery of a vehicle.

This section provides background information related to the present disclosure which is not necessarily prior art.

High-energy-density electrochemical cells, such as lithium ion batteries and lithium sulfur batteries, can be used in a variety of consumer products and vehicles, such as hybrid electric vehicles and electric vehicles. Typical lithium ion and lithium sulfur batteries include a first electrode (for example, a cathode), a second electrode (for example, an anode), an electrolyte material, and a separator. A cell capacity of a battery may decline as the battery ages. Under some circumstances, the battery may gradually age and then experience rapid cell capacity loss.

SUMMARY

This section provides a general summary of the disclosure, and is not a comprehensive disclosure of its full scope or all of its features.

The present disclosure relates to detection and mitigation of rapid capacity loss for aging batteries. A battery control system for a vehicle includes a battery state estimator configured to obtain a battery cell open circuit voltage (OCV) of a battery in response to a charging system charging the battery to a maximum charging voltage. The system also includes a negative voltage determination module configured to determine a negative OCV of the battery based on the obtained cell or battery OCV. The system further includes a voltage shift determination module configured to identify a difference between the negative OCV of the battery and a previous negative OCV of the battery. The system also includes a charge voltage module configured to selectively reduce the maximum charging voltage to a reduced maximum charging voltage based on the difference and transmit the reduced maximum charging voltage to the charging system. The charging system is instructed to charge the battery such that the battery does not exceed the reduced maximum charging voltage.

In other features, the battery state estimator is configured to store the obtained battery cell OCV of the battery in response to the obtained battery cell OCV being measured a predetermined period after the charging system charges the battery to the maximum charging voltage. In other features, a voltage sensor is configured to measure the OCV of the battery. In other features, the charging system receives a measured voltage from the voltage sensor and reduces a charging current supplied to the battery in response to the measured voltage from the voltage sensor reaching at least one of: (i) the maximum charging voltage and (ii) the reduced maximum charging voltage.

In other features, an overpotential identification module is configured to obtain the OCV of the battery a predetermined period after the charging system charges the battery to the maximum charging voltage and determine a cell overpotential of the battery associated with the OCV of the battery. In other features, the charging voltage module is configured to selectively reduce the maximum charging voltage by the determined cell overpotential or an amount based on the determined cell overpotential. In other features, the battery state estimator is configured to obtain the OCV of the battery a predetermined period following the battery reaching full charge or the maximum charging voltage. In other features, the battery is under zero load during the predetermined period. In other features, the battery control system is included in a vehicle, and the vehicle includes a display. In other features, the voltage shift determination module transmits a cell capacity alert to the display, and, in response to receiving the cell capacity alert, the display produces at least one of: a visual alert, an audible alert, and a haptic feedback alert.

In other features, the maximum charging voltage is reduced by an amount based on the difference between the negative OCV of the battery and the previous negative OCV of the battery. In other features, a negative OCV history includes an original negative OCV of the battery and the previous OCV of the battery. In other features, the previous negative OCV of the battery is an original negative OCV of the battery. In other features, the charge voltage module selectively reduces the maximum charging voltage of the battery in response to the difference exceeding a threshold value. In other features, the charge voltage module sets the previous negative OCV of the battery equal to the negative OCV of the battery.

A battery control system for a vehicle includes an overpotential identification module configured to obtain an open circuit voltage (OCV) of a battery a predetermined period after a charging system charges the battery to a maximum charging voltage. The system also includes a cell overpotential change determination module configured to determine a cell overpotential of the battery based on the obtained OCV. The system further includes a voltage shift determination module configured to determine a slope of the cell overpotential using the cell overpotential of the battery and a previous cell overpotential of the battery. The system also includes a charge voltage module configured to selectively reduce the maximum charging voltage to a reduced maximum charging voltage based on the slope and transmit the reduced maximum charging voltage to the charging system. The charging system is instructed to charge the battery such that the battery does not exceed the reduced maximum charging voltage. In other features, the overpotential identification module includes a voltage sensor configured to measure the OCV across terminals of the battery.

A battery control method for a vehicle includes obtaining an open circuit voltage (OCV) of a battery in response to charging the battery to a maximum charging voltage and determining a negative OCV of the battery based on the obtained OCV. The method also includes identifying a difference between the negative OCV of the battery and a previous negative OCV of the battery and selectively reducing the maximum charging voltage to a reduced maximum charging voltage based on the difference. The method further includes transmitting the reduced maximum charging voltage to a charging system and instructing the charging system to charge the battery such that the battery does not exceed the reduced maximum charging voltage.

In other features, obtaining the OCV of the battery occurs a predetermined period after charging the battery to the maximum charging voltage. In other features, the method includes determining a cell overpotential of the battery corresponding to the OCV of the battery and selectively reducing the maximum charging voltage by an amount based on the cell overpotential. In other features, obtaining the OCV of the battery occurs while the battery is under zero load. In other features, the maximum charging voltage is reduced by an amount based on the difference between the negative OCV of the battery and the previous negative OCV of the battery. In other features, the maximum charging voltage of the battery is selectively reduced in response to the difference exceeding a threshold value.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 6A is a graphical depiction of changes over a battery lifetime to cell capacity and cell overpotential measured after a one hour rest period.

FIG. 6B is a graphical depiction of changes over a battery lifetime to cell capacity and cell overpotential measured after a one minute rest period.

FIG. 7 is a graphical depiction of changes to cell capacity, cell overpotential, and negative OCV over a battery lifetime.

Corresponding reference numerals indicate corresponding parts throughout the several views of the drawings.

DETAILED DESCRIPTION

Example embodiments will now be described more fully with reference to the accompanying drawings.

A battery charge adjustment system is presented for adjusting a maximum voltage of a battery in response to an open circuit voltage (OCV) of the battery indicating that the cell capacity of the battery is declining. When the OCV indicates that the cell capacity of the battery is declining, the battery charge adjustment system may lower the maximum voltage of the battery to limit how much the battery is charged in subsequent cycles. Lowering the maximum voltage of the battery may avoid or delay the onset of rapid cell capacity loss, extending the lifetime of the battery.

The OCV of the battery may be measured by measuring the voltage across the terminals of the battery or may be obtained from an onboard battery state estimator of the vehicle. Using a stoichiometric fit model, positive OCV and negative OCV alignments can be determined from the OCV.

By definition, the OCV of the battery is equal to the positive OCV less the negative OCV. In various implementations, the negative OCV at maximum charge may be monitored to identify changes that indicate the battery is experiencing cell capacity loss. For example, an indicator that the battery is entering rapid cell capacity loss is the negative OCV beginning to shift to a higher plateau.

Cell overpotential may also indicate when the battery is entering rapid cell capacity loss. In various implementations, the cell overpotential of the battery may be determined based on the measured OCV. The cell overpotential is a measure of a cell impedance representing the difference in the voltage of the battery under two different operating conditions. The cell overpotential can be calculated as the maximum voltage of the battery under charge, set and adjusted by the presently disclosed system, less the measured OCV, which is measured after the battery has been fully charged and rested under zero load for a predetermined period. The cell overpotential may increase by the same amount as the shift in the negative OCV. Therefore, an indicator that the battery is entering a regime of rapid cell capacity loss may be the cell overpotential beginning to rapidly increase.

Once the system identifies that the battery may be entering rapid cell capacity loss, the battery charge adjustment system may lower the maximum voltage of the battery: for example, by a difference between an original negative OCV plateau of the battery and the present negative OCV plateau of the battery. In this way, for subsequent cycles, the maximum voltage of the battery is adjusted, preventing the battery from being charged to a higher voltage and delaying rapid cell capacity loss.

Figure 1:
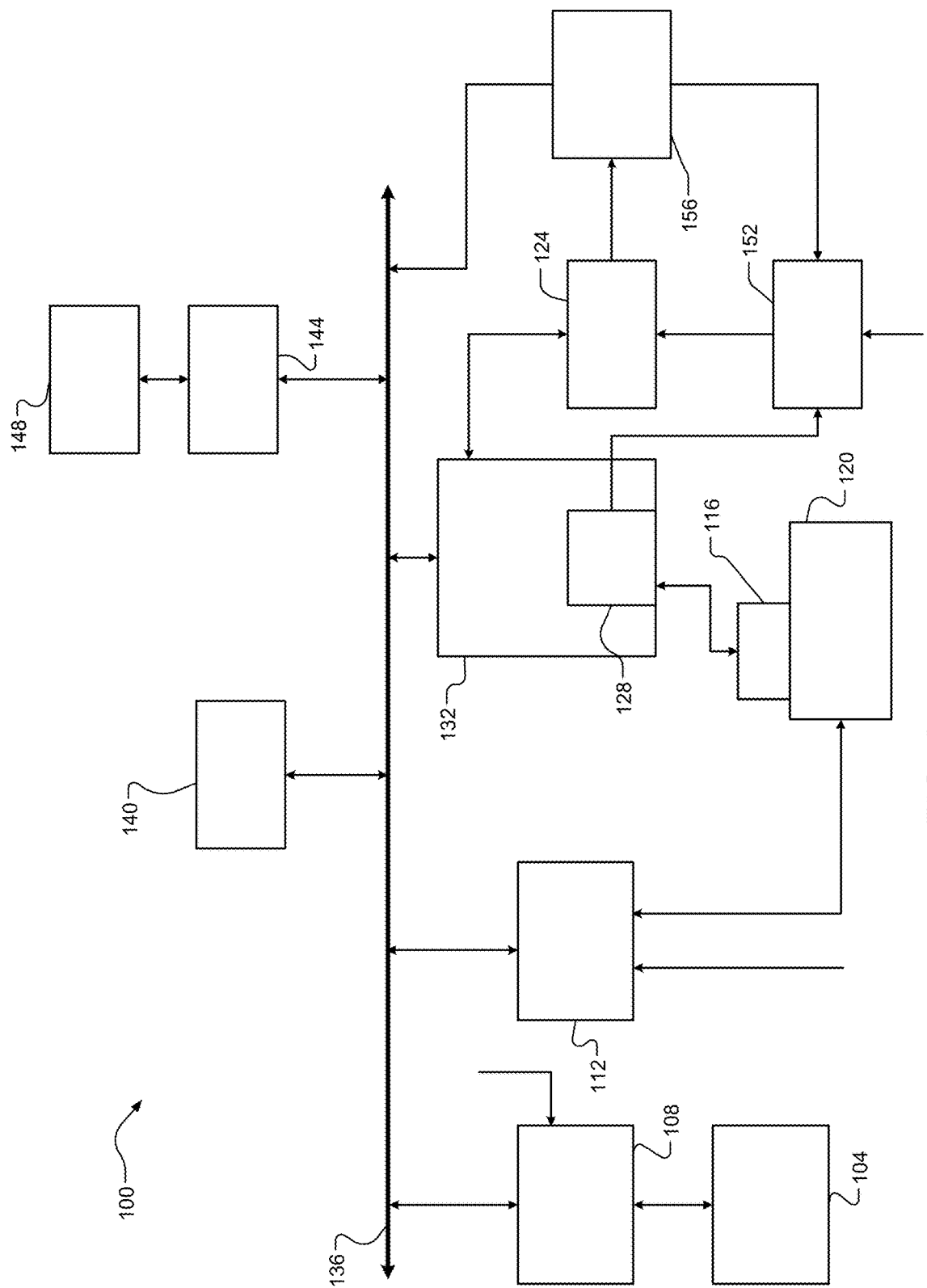
FIG. 1 is a functional block diagram of an example vehicle.

Referring now to FIG. 1, a functional block diagram of an example vehicle 100 is presented. While the vehicle 100 is shown and described as a hybrid vehicle, the present disclosure is also applicable to non-hybrid vehicles, electric vehicles, and fuel cell vehicles. The present disclosure is applicable to autonomous vehicles, semi-autonomous vehicles, non-autonomous vehicles, and other types of vehicles.

An engine 104 combusts an air/fuel mixture to generate drive torque. An engine control module (ECM) 108 controls the engine 104 based on a torque request, such as a torque request determined based on one or more driver inputs. For example, the ECM 108 may control actuation of engine actuators, such as a throttle valve, one or more spark plugs, one or more fuel injectors, valve actuators, camshaft phasers, an exhaust gas recirculation (EGR) valve, one or more boost devices, and other suitable engine actuators.

The engine 104 may output torque to a transmission 110. A transmission control module (TCM) 112 controls operation of the transmission 110. For example, the TCM 112 may control gear selection within the transmission 110 and one or more torque transfer devices (e.g., a torque converter, one or more clutches, etc.).

The vehicle 100 may include one or more electric motors. For example, a single electric motor 116 may be coupled to the transmission 110 as shown in the example of FIG. 1. In various implementations, the electric motor 116 may be located within a housing of the transmission 120. In various implementations, the electric motor 116 can alternate between acting as either a generator and as a motor. When acting as a generator, the electric motor 116 converts mechanical energy into electrical energy. The electrical energy can be, for example, used to charge a battery 124 via a power control device (PCD) 128. When acting as a motor, the electric motor 116 generates torque that may be used, example, to supplement or replace torque output by the engine 104. While the example of one electric motor is provided, the vehicle may include zero or more than one electric motor.

A power inverter module (PIM) 132 may control the electric motor 116 and the PCD 128. The PCD 128 converts direct current power from the battery 124 to alternating current for the electric motor 116 based on signals from the PIM 132. The PCD 128 may also provide power output by the electric motor 116 to the battery 124.

Modules of the vehicle 100 may share parameters via a network 136, such as a controller area network (CAN). In vehicles, CAN may also stand for car area network. The network 136 may include one or more data buses. Various parameters may be made available by one control module to other control modules via the network 136.

The driver inputs may include, for example, an accelerator pedal position (APP), which may be provided to the ECM 108. A position of a range selector, such as a park, reverse, neutral, drive, low (PRNDL) selector, may be provided to the TCM 112.

The vehicle may also include sensors 140. Examples of the sensors 140 include one or more laser imaging distancing and ranging (LIDAR) sensors, one or more radar sensors, one or more cameras, and one or more sonar sensors. One or more control modules may control respective devices based on input from one or more of the sensors 140. For example, the ECM 108 may control the engine 104 based on input from the sensors 140.

The vehicle system also includes an infotainment module 144. The infotainment module 144 controls what is displayed on a display 148. The display 148 may be a touchscreen display in various implementations and transmit signals indicative of user input to the display 148 via the infotainment module 144. The infotainment module 144 may additionally or alternatively receive signals indicative of user input from one or more other user input devices, such as one or more switches, buttons, knobs, etc.

The infotainment module 144 may also generate output via one or more other devices. For example, the infotainment module 144 may output sound via one or more speakers of the vehicle 100. The vehicle 100 may include one or more additional control modules that are not shown, such as a chassis control module, a battery pack control module, etc. The vehicle 100 may omit one or more of the control modules shown and discussed.

A charging system 152 may receive power and charge the battery 124. The power may be received from a wall outlet providing, for example, AC power. A battery charge adjustment module 156 may adjust the amount the battery 124 is charged via the charging system 152. For example, the battery charge adjustment module 156 may transmit a maximum voltage value to the charging system 152. The charging system 152 may charge the battery 124 until the maximum voltage value is reached.

In various implementations, the battery charge adjustment module 156 may send an alert to the infotainment module 144 in response to an adjustment of the maximum voltage value. The infotainment module 144 may then display the alert on the display 148 indicating the maximum voltage value of the battery 124 has been adjusted, lowering the charge of the battery 124. This may allow the infotainment module 144 to display an expected useable lifetime of the battery 124 on the display 148.

Figure 2:
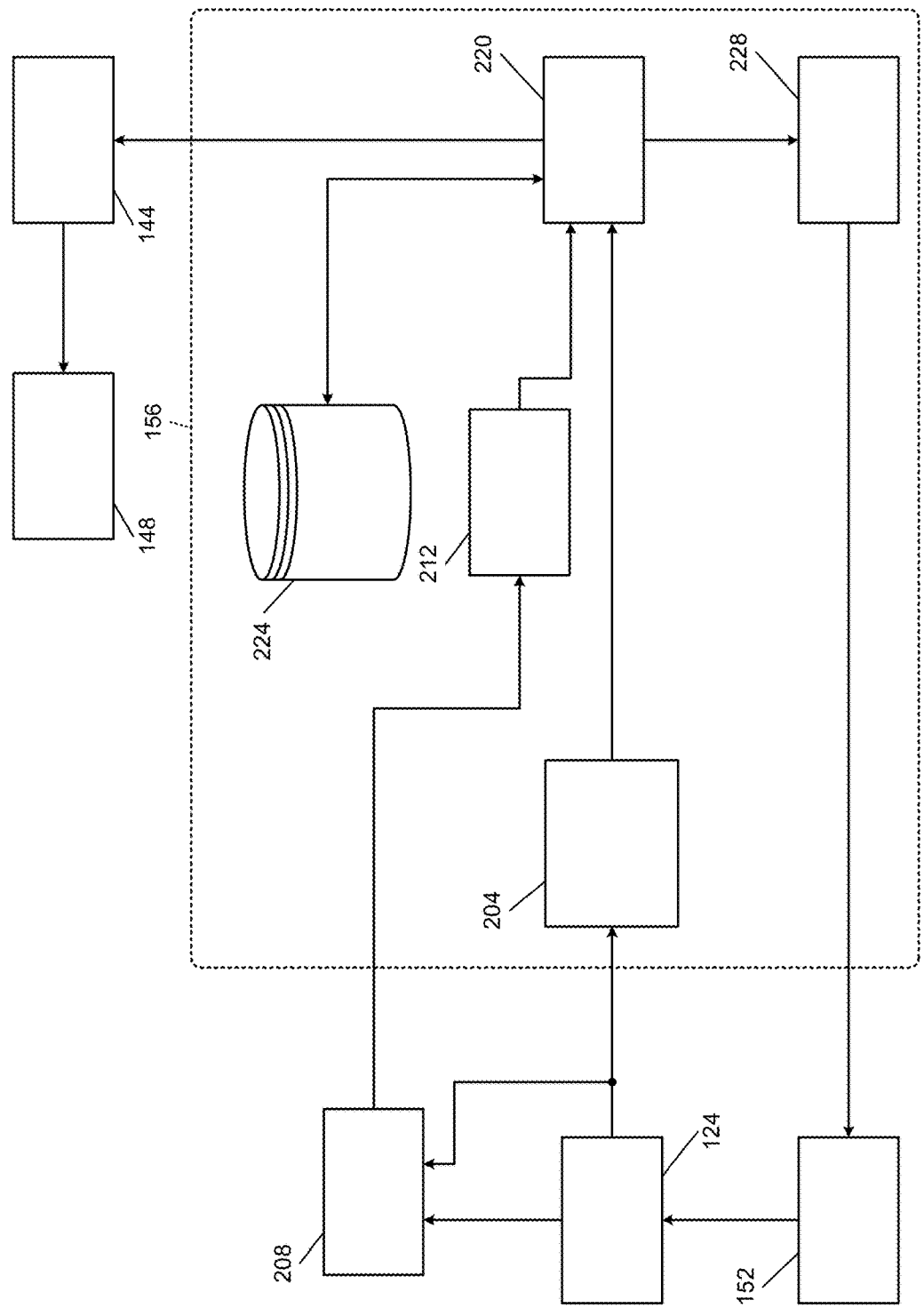
FIG. 2 is a functional block diagram of an example implementation of a battery charge adjustment module.

Referring to FIG. 2, a functional block diagram of an example implementation of the battery charge adjustment module 156 is depicted. The battery charge adjustment module 156 includes an overpotential identification module 204 that receives a measured OCV of the battery 124. For example, a voltage sensor may measure the OCV of the battery 124 and transmit the measured OCV to the overpotential identification module 204. Alternatively, the overpotential identification module 204 may include the voltage sensor to measure the OCV of the battery 124.

The overpotential identification module 204 monitors the measured OCV of the battery 124. Once the battery 124 has reached the maximum voltage, as dictated by the charging system 152, the overpotential identification module 204 may store the maximum voltage of the battery 124, which is equivalent to the amount the battery 124 was charged by the charging system 152. In various implementations, the maximum voltage used by the charging system 152 is a predetermined value. Then, the overpotential identification module 204 waits for a predetermined period while the battery 124 is under no load. After the predetermined period under no load has expired, the overpotential identification module 204 is triggered to store the measured OCV of the battery 124. Using equations 2 and 3, discussed below, the overpotential identification module may calculate the overpotential based on the maximum voltage the battery 124 was charged and the measured OCV of the battery 124 after the predetermined period.

In various implementations, before storing the OCV of the battery 124, the overpotential identification module 204 waits for the predetermined period after any charging or discharging of the battery 124. The overpotential identification module 204 maintains a storage of the measured OCV of the battery 124 each time the battery 124 is fully charged, which indicates the completion of one battery cycle. A battery cycle is when the battery 124 is at least partially depleted and subsequently fully charged. The cell capacity of the battery 124 may decline at a steady rate after multiple cycles. In various implementations, when identifying rapid cell capacity loss in a battery based on a negative OCV, discussed below, the battery charge adjustment module 156 may exclude the overpotential identification module 204.

In various implementations, the battery charge adjustment module 156 may receive the measured OCV of the battery 124 during various SOC increments from a battery state estimator 208 of the vehicle. The battery state estimator 208 monitors and stores an SOC of the battery 124 as well as an OCV of the battery 124. In various implementations, the battery charge adjustment module 156 may receive the measured OCV of the battery 124 from the battery state estimator 208.

In various implementations, the cell capacity can decline rapidly, resulting in an end of useable life of the battery 124. Shifts in a negative OCV and an increase in a cell overpotential of the battery 124 may indicate an onset of rapid cell capacity decline. A stoichiometric fit module 212 (also referred to as a negative OCV determination module) receives the measured OCV stored in the battery state estimator 208 and determines the negative OCV of the battery 124.

The stoichiometric fit module 212 determines alignment of a positive OCV of the battery 124 and the negative OCV of the battery 124 based on the measured OCV. Specifically, the measured OCV is equivalent to the positive OCV less the negative OCV. In various implementations, the stoichiometric fit module 212 is applied to the measured OCV to determine an alignment of a negative electrode and a positive electrode, representing the negative OCV and the positive OCV, respectively. In various implementations, the stoichiometric fit module 212 may output the negative OCV of the battery at the maximum voltage or full charge.

The negative and positive electrode alignment may be described in the context of stoichiometry, which indicates a quantitative relationship between products and reactants in a chemical reaction. The stoichiometric term of the alignment is an accounting of how much lithium is transferred from the anode or negative electrode to the cathode or positive electrode during discharge and is expressed relative to the total lithium storage capacity of each electrode. In various implementations, the stoichiometric fit module 212 may use equation 1, below, to calculate the alignment of the positive OCV and negative OCV of the battery 124.

$$OCV(SOC)=U_p(y_f-SOC^*(y_f-y_i))-U_n(x_i+SOC^*(x_i-x_f)) \quad (1)$$

where SOC is the state of charge of the battery 124, OCV(SOC) is the measured OCV at the SOC, $U_p$ is the positive OCV alignment at the SOC, $U_n$ is the negative OCV alignment at the SOC, $y_i$ is the initial positive OCV when the battery is fully charged, $y_f$ is the final positive OCV when the battery is fully discharged, $x_i$ is the initial negative OCV when the battery is fully charged, and $x_f$ is the final negative OCV when the battery is fully discharged.

The positive OCV, $U_p$, represents the potential difference between the positive electrode and a reference electrode, and the negative OCV, $U_n$, represents the potential difference between the negative electrode and the same reference electrode. In various implementations, the reference electrode may be lithium metal, which has a fixed and unchanging potential that may be 0.0V. A reference electrode may be fabricated from materials other than lithium metal with different but fixed and unchanging potentials. Methods and devices for measuring the positive and negative OCVs using a reference electrode are understood. An example of such a reference—electrode-based measurement technique is disclosed in U.S. Pat. No. 8,586,222, the disclosure of which is hereby incorporated by reference in its entirety.

The measured OCV, OCV, represents a difference between the positive OCV and the negative OCV, which can be determined at a given magnitude of SOC. Additional details regarding the determination of the positive OCV and negative OCV are disclosed in U.S. Pub. No. 2018/0284195, the disclosure of which is hereby incorporated by reference in its entirety. In various implementations, the battery charge adjustment module 156 may include a lookup table including estimated negative OCV values indexed by the measured OCV. This lookup table may be populated empirically based on measurements of a battery performed in a laboratory or in an instrumented vehicle.

Figure 4A:
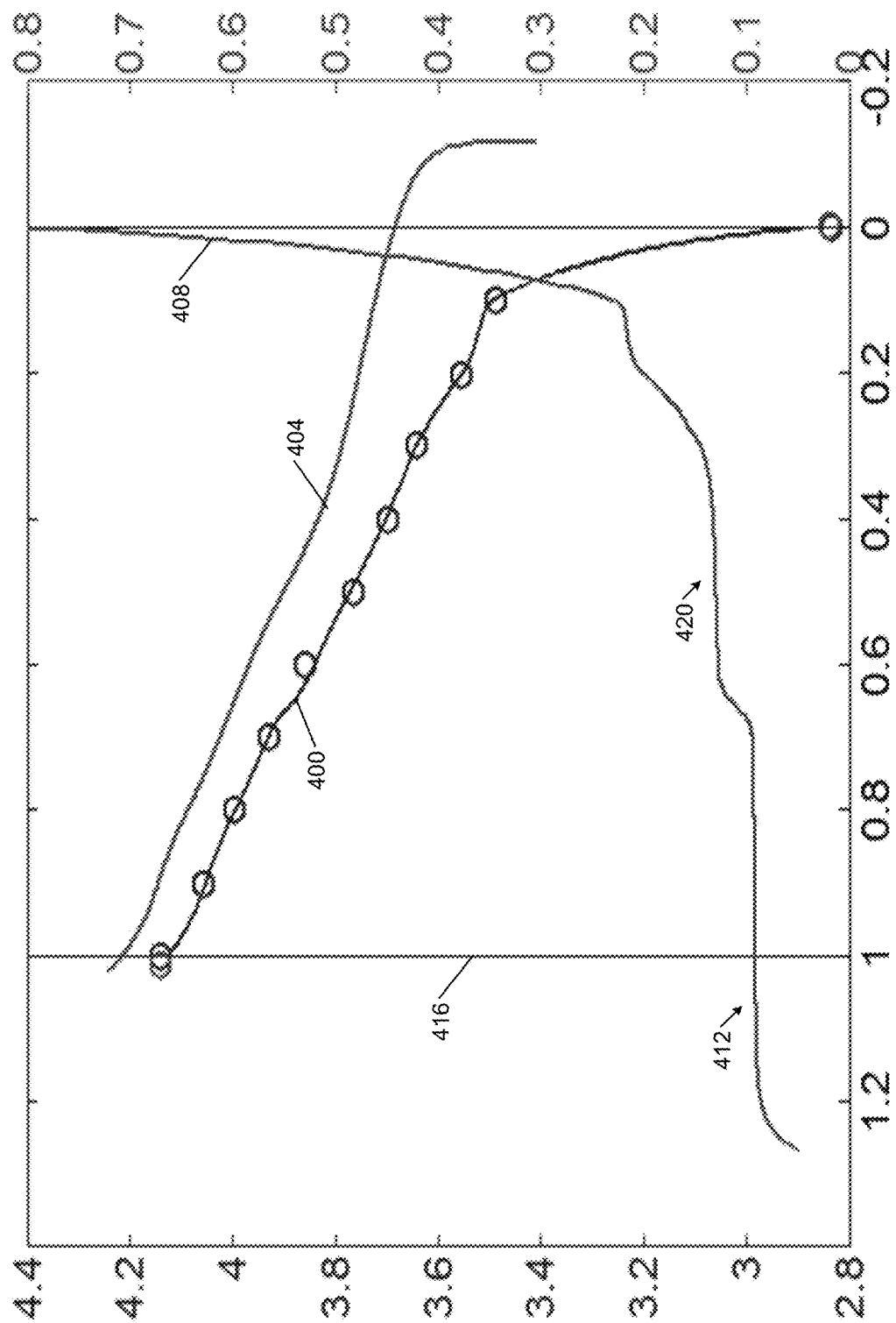
FIG. 4A is a graphical depiction of a measured OCV trace, a positive OCV trace, and a negative OCV trace of a battery during a particular battery cycle.
Figure 4B:
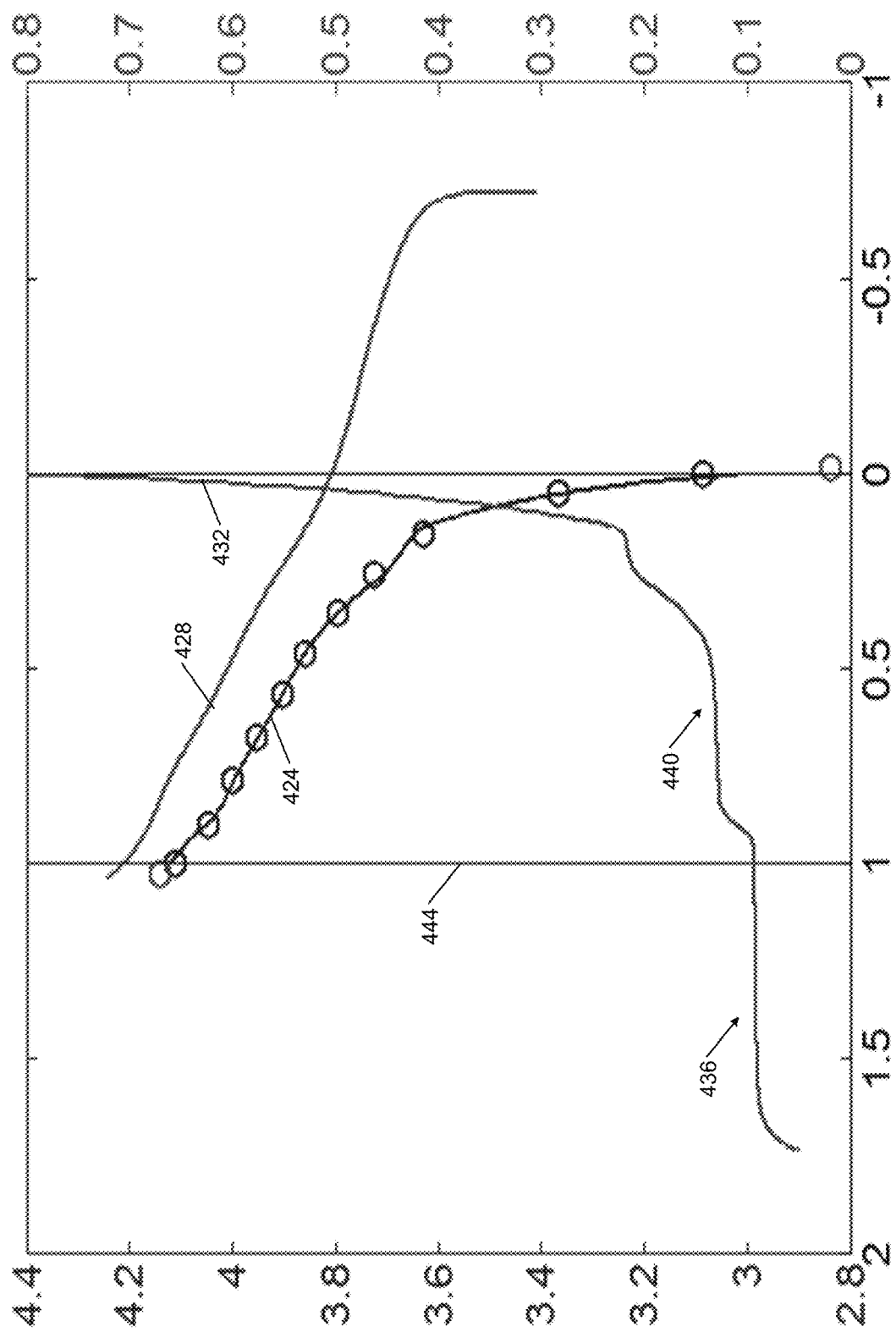
FIG. 4B is a graphical depiction of a measured OCV trace, a positive OCV trace, and a negative OCV trace of a battery during another particular battery cycle.
Figure 4C:
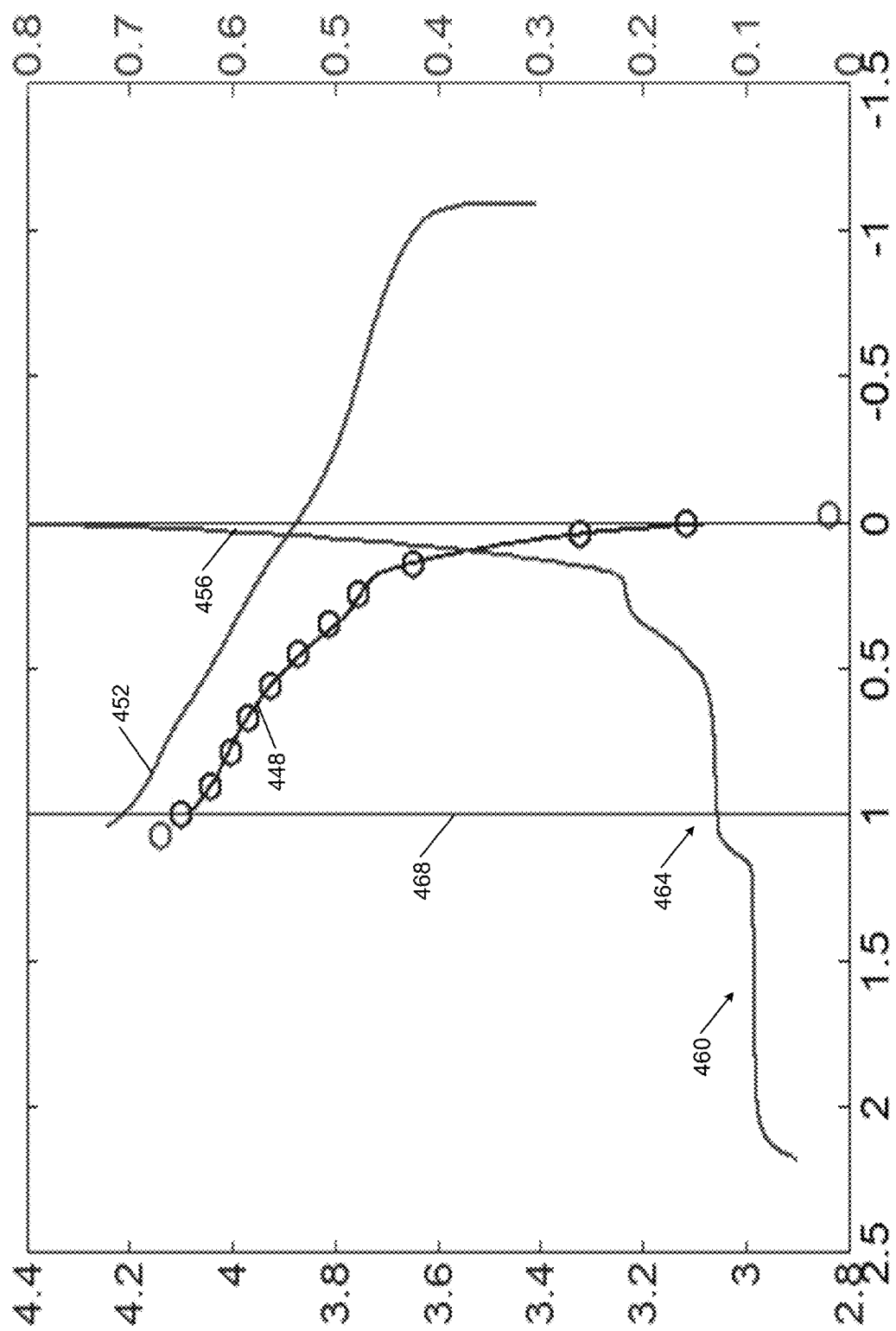
FIG. 4C is a graphical depiction of a measured OCV trace, a positive OCV trace, and a negative OCV trace of a battery during yet another particular battery cycle.
Figure 5:
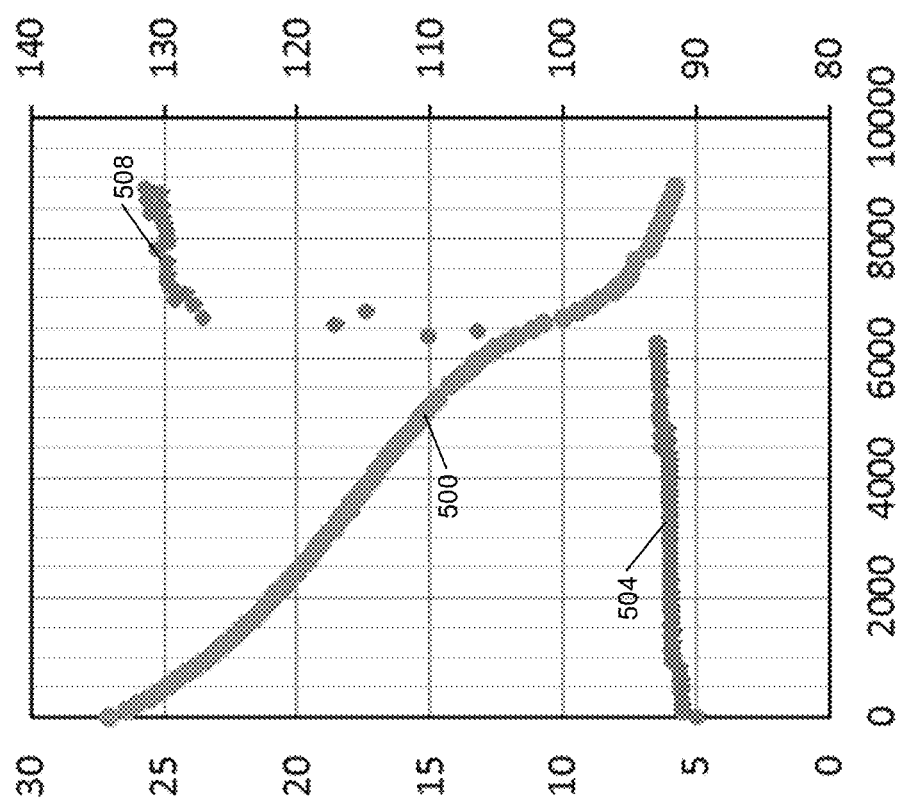
FIG. 5 is a graphical depiction of changes to cell capacity and full-charge negative OCV over a battery lifetime.

As shown in FIGS. 4A-4B, the negative OCV remains at a first plateau when the battery 124 is fully charged and when the battery 124 is new. As the battery 124 ages, the negative OCV shifts to a second value when the battery 124 is fully charged, plateauing at the second value, as shown in FIG. 4C. The shift in the negative OCV occurs at the same time as rapid cell capacity decline or roll-over (as depicted in FIG. 5).

In various implementations, the cell overpotential of the battery 124 may be determined by the overpotential identification module 204. Similar to the rapid cell capacity decline and at the same time as the negative OCV shift, the cell overpotential begins to rapidly increase, identified by a change in cell overpotential. For example, the change may be identified by observing an increased rate of change of the cell overpotential. For example, an exponentially weighted moving average (EWMA) of the piecewise slope of cell overpotentials may be compared to a threshold. The EWMA surpassing the threshold may identify the faster increase of the cell overpotential.

The following equation 2, below, shows the relationship between cell overpotential and negative OCV at full charge (SOC=1):

$$V_{max}=U_{p_o}-U_{n_o}+OP_0, \quad (2)$$

where $V_{max}$ is the maximum voltage of the battery 124, $U_{p_o}$ is the positive OCV of the battery 124, $U_{n_o}$ is the negative OCV of the battery 124, and $OP_o$ is the cell overpotential of the battery 124.

To measure the cell overpotential, the overpotential identification module 204 may store the measured OCV of the battery 124 after the predetermined period passes with the battery 124 under no load. Then, the overpotential identification module 204 may calculate the cell overpotential according to equation 3, below:

$$OP_o=V_{max}-OCV_o, \quad (3)$$

where $OCV_o$ is equal to $U_{p_o}-U_{n_o}$.

A voltage shift determination module 220 may receive the negative OCV from the stoichiometric fit module 212. The voltage shift determination module 220 may store the negative OCV in a negative OCV & overpotential history 224. The voltage shift determination module 220 may access the negative OCV & overpotential history 224 to compare the negative OCV to a previous negative OCV of the battery 124.

The voltage shift determination module 220 compares the negative OCV to the previous negative OCV. The previous negative OCV may be the original negative OCV recorded when the battery 124 was new. Alternatively, the previous negative OCV could have been measured at any time prior to the measuring of the present OCV.

If the voltage shift determination module 220 determines that the negative OCV is different from the previous negative OCV, the voltage shift determination module 220 may transmit the difference to a charge voltage module 228. The voltage shift determination module 220 may send the difference to the charge voltage module 228 when the difference between the negative OCV and the previous negative OCV is beyond a threshold value. For example, certain batteries may have a set value between the first plateau and the second plateau, described above. As depicted in subsequent figures, one example of the difference between the two plateaus is 36 mV. Therefore, for the battery 124 depicted, the voltage shift determination module 220 may only transmit the difference to the charge voltage module 228 if the difference is greater than a threshold such as 18 mV, 30 mV, 33 mV, or 35 mV.

In various implementations, the voltage shift determination module 220 may send the difference to the charge voltage module 228 if any difference exists between the negative OCV and the previous negative OCV. In this way, when any difference exists, the battery charge adjustment module 156 can adjust the maximum voltage of the battery 124 to delay an onset of rapid cell capacity loss.

In various implementations, the overpotential identification module 204 may transmit the measured cell overpotential of the battery 124 measured at the beginning of each cycle to the voltage shift determination module 220, and the voltage shift determination module 220 may store the calculated cell overpotential in the negative OCV & overpotential history 224. The voltage shift determination module 220 may compare the presently calculated cell overpotential to a previous cell overpotential retrieved from the negative OCV & overpotential history 224 to determine a rate of change of the cell overpotential.

In various implementations, the presently calculated cell overpotential may be compared to the cell overpotential over the lifetime of the battery 124 to identify if the cell overpotential is beginning to increase at a faster rate. As described above, in various implementations, the voltage shift determination module 220 may identify a rate of change of the cell overpotential by comparing a slope of the presently calculated cell overpotential and a slope of a previously calculated cell overpotential. In response to the slope (or a filtered version of the slope, such as an EMWA of the slope) exceeding a threshold, a difference is calculated between the present cell overpotential and the earliest cell overpotential. The voltage shift determination module 220 transmits the difference to the charge voltage module 228.

Once the charge voltage module 228 receives the difference, the charge voltage module 228 determines an adjustment of the maximum voltage of the battery 124. In various implementations where the negative OCV is monitored, the charge voltage module 228 may change the maximum voltage by the difference. For example, if the original negative OCV was 92 mV and the present negative OCV is 128 mV, the charge voltage module 228 may reduce the maximum voltage of the battery 124 by 36 mV. The charge voltage module 228 may also change the maximum voltage by an amount based on the difference. For example, the charge voltage module 228 may change the maximum voltage by an amount exceeding the difference by 10 mV.

In various implementations, the charge voltage module 228 may lower the maximum voltage by a second difference between the negative OCV and a negative OCV calculated the last time the maximum voltage was lowered. The charge voltage module 228 instructs the charging system 152 to charge the battery 124 to the calculated maximum voltage. In other implementations where the cell overpotential is monitored, the charge voltage module 228 may reduce the maximum voltage of the battery 124 by the presently calculated cell overpotential. The maximum voltage of the battery 124 may be reduced by an amount based on the presently calculated cell overpotential. For example, the maximum voltage of the battery 124 may be reduced by an amount proportional to the calculated cell overpotential, such as an amount that is 10% higher than the calculated cell overpotential. In various implementations, as the battery 124 reaches the maximum voltage or the reduced maximum voltage, the charging system 152 may lower a charging current so as to not exceed the maximum or reduced maximum voltage.

In various implementations, the voltage shift determination module 220 may generate and transmit an alert to the infotainment module 144. The alert is transmitted in response to the battery 124 experiencing indicators of the onset of rapid cell capacity loss—for example, an increase in the negative OCV of the battery 124. In response to receiving the alert, the infotainment module 144 displays the alert via the display 148. In various implementations, the alert may be a visual alert or an audible alert and may provide haptic feedback.

Figure 3A:
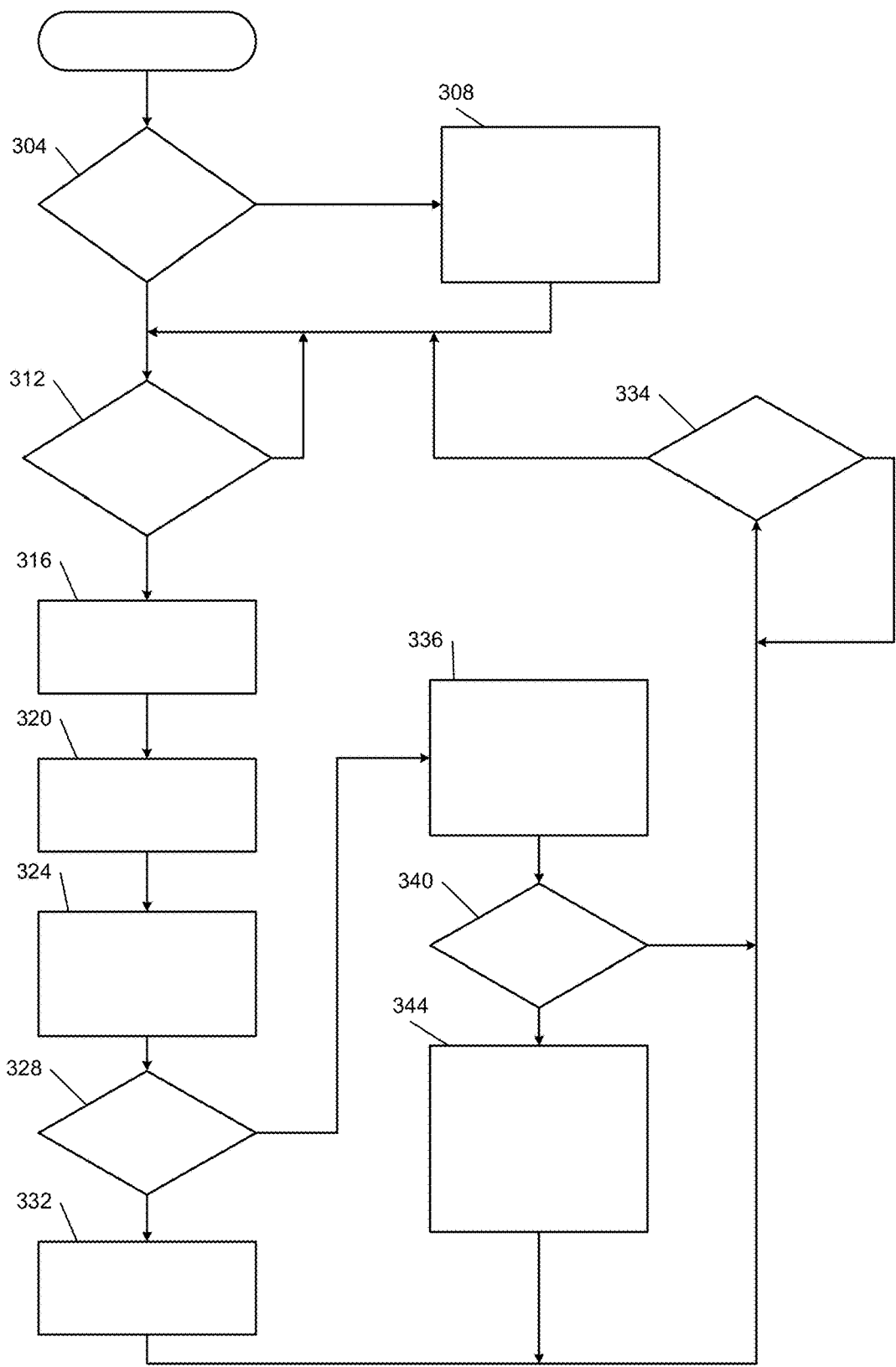
FIG. 3A is a flowchart depicting an example implementation of adjusting a maximum voltage of a battery based on a negative open circuit voltage (OCV) of the battery.

Referring to FIG. 3A, a flowchart depicts an example implementation of a battery maximum voltage adjustment based on the negative OCV of the battery. Control begins at 304 upon startup of a vehicle, where control determines if a new battery has been installed. If yes, control (i) proceeds to 308 to clear an original negative OCV and sets a maximum voltage of the battery to a predetermined maximum value and (ii) continues to 312. Otherwise, control continues to 312. In other implementations, instead of beginning upon vehicle startup, control is always operating and obtaining a measured OCV of the battery under no load.

Then, at 312, control determines if the battery has been fully charged (that is, to the maximum voltage). If no, control waits until the battery has been fully charged. If yes, control proceeds to 316 where control waits for a predetermined period of time. In various implementations, the predetermined period may be one minute, one hour, or another set amount of time for the battery to rest after being fully charged. In various implementations, control waits until the battery has been under zero load continuously for the predetermined period following being fully charged.

After waiting the predetermined period, control continues to 320 to measure and store the present OCV. The battery state estimator 216 of FIG. 2 may measure the OCV of the battery at various SOCs of the battery while the battery is being discharged over a cycle. The battery state estimator 216 measures the OCV of the battery at various increments during each cycle, when the battery is under zero load. At 324, control determines a negative OCV of the present OCV using a stoichiometric fit model.

At 328, control determines if the original negative OCV is cleared (not yet set to a value). If control determines that the original negative OCV is cleared, a new battery has recently been installed and the original negative OCV needs to be set to a value, so control continues to 332, where the original negative OCV is set to the presently determined negative OCV. Then, control proceeds to 334 to determine if the battery is discharged by a predetermined amount. In various implementations, the predetermined amount may correspond to fully discharged, partially discharged, or any amount less than fully charged. If no, control waits until the battery is discharged. Otherwise, control returns to 312 to determine if the battery is charged to the maximum voltage.

However, if at 328 the original negative OCV has already been set, control continues to 336. At 336, control determines a difference between the present negative OCV and the original negative OCV. At 340, if the difference is greater than a threshold, control continues to 344 to set the maximum voltage of the battery equal to the predetermined maximum value less the present negative OCV. In other words, if the present negative OCV has shifted from the original negative OCV by the threshold value, control shifts the maximum voltage of the battery by the same amount. In this way, the maximum amount the battery may be charged is lowered to delay the onset of rapid cell capacity loss as the shift in the negative OCV indicates the battery may be beginning to decay at a higher rate. Control then continues to 334 to determine if the battery is discharged. If, at 340, the difference is not greater than the threshold value, control proceeds directly to 334.

Figure 3B:
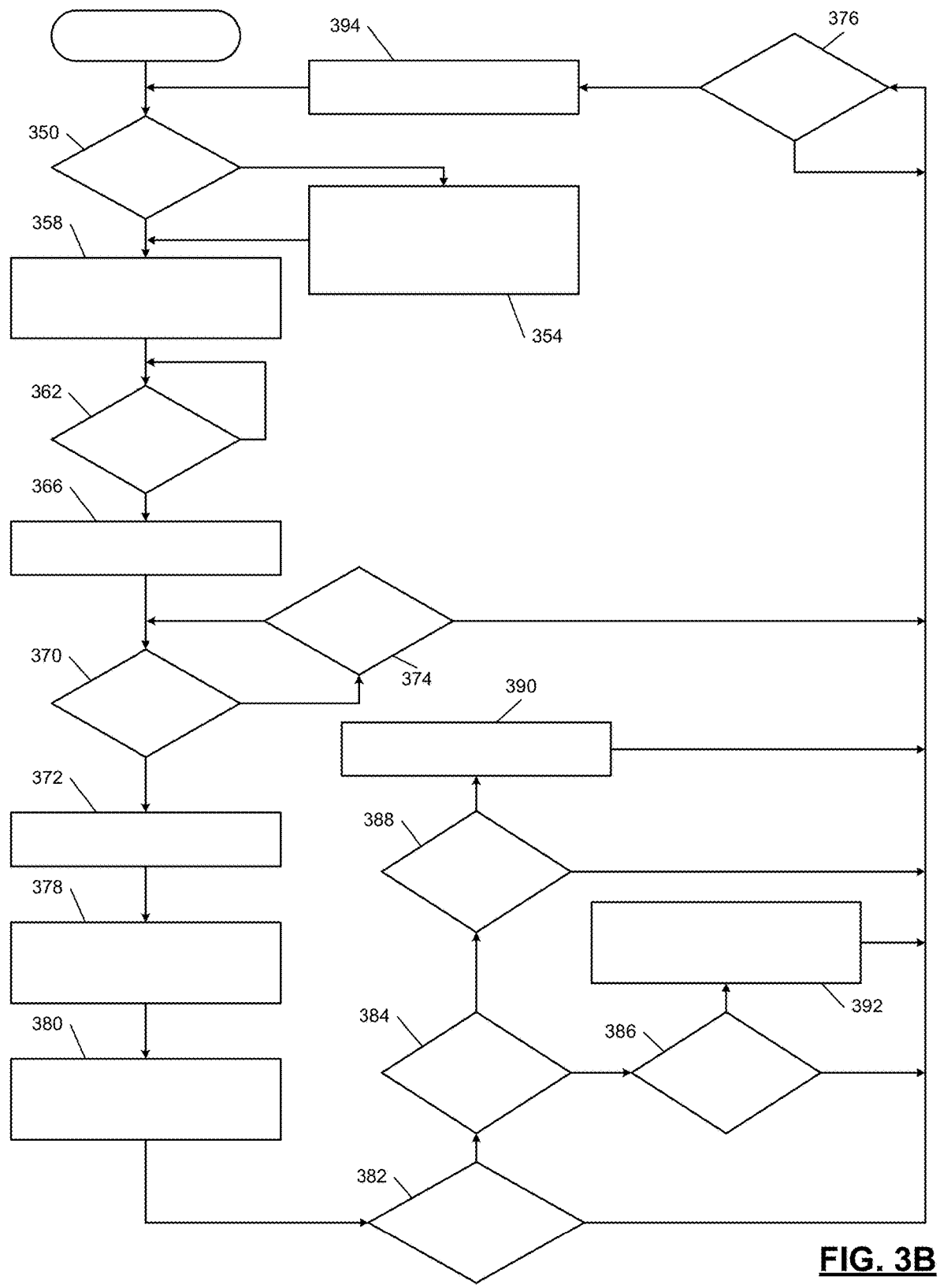
FIG. 3B is a flowchart depicting an example implementation of adjusting a maximum voltage of a battery based on a cell overpotential of the battery.

FIG. 3B is a flowchart of example modification of battery charging according to the principles of the present disclosure. Control begins at 350, such as at power-on of the vehicle or at power-on of a battery charging system of the vehicle. In other implementations, control never ends. This may be true when, for example, the battery charging system of a vehicle is always monitoring state of charge of the battery and preparing for recharging.

At 350, control determines whether a new battery has been installed. If so, control transfers to 354 to initialize variables. Otherwise, control transfers to 358. At 354, control clears a flag named Plateau_Flag. This flag indicates that a plateau in overpotential has been reached. The plateau precedes a rapid upswing in overpotential of the battery:

therefore, once the Plateau_Flag has been set, control can begin monitoring for the upswing.

Control also sets a maximum voltage value to a predetermined maximum value. The maximum voltage value is used to constrain charging of the battery. The predetermined maximum value may be set based on battery chemistry and may be programmed into the vehicle during manufacturing. Control also sets a variable named Cycle_Count to zero. This variable counts the number of charging/discharging cycles experienced by the battery. Control then continues to 358.

At 358, control instructs the battery charging system to use the maximum voltage value. In other words, the battery charging system is instructed to only charge the battery up to the maximum voltage value and not to a higher voltage. The battery charging system may make independent judgments about when to charge the battery. For example, the battery charging system may wait until the battery has been discharged by a predetermined amount before beginning recharging.

In various implementations, the battery charging system uses a combination of constant current and constant voltage charging. For example, the battery charging system may initially charge the battery using an approximately constant current (such as 1 C) until the maximum voltage value has been reached. Then, the battery charging system switches to constant voltage mode and continues to supply current to the battery while maintaining the battery voltage at the maximum voltage value. The constant voltage charging may be terminated when the amount of current being delivered to the battery tapers to a predetermined level (such as 0.05 C).

At 362, control determines whether the battery has been fully charged. If so, control transfers to 366; otherwise, control remains at 362. A determination that the battery has been fully charged may be made based on a signal from the battery charging system, which may indicate that the constant current and constant voltage regimes have both completed.

At 366, control starts a timer counting toward zero from a predetermined value. For example, this value may represent one minute, one hour, or another period of time. In some implementations, the predetermined value may be zero, essentially skipping any delay imposed by the timer. At 370, control determines whether the timer has expired. If so, control transfers to 372; otherwise, control transfers to 374. At 374, the timer has not yet expired so control determines whether there has been a load placed on the battery. If so, a reliable overpotential reading may not be possible and control then transfers to 376. Otherwise, if there has been no load on the battery, control returns to 370 to determine whether the timer has expired.

At 372, control measures an open circuit voltage of the battery. The open circuit voltage may be defined as a measurement of the voltage across the battery terminals when no load and no charging current is being applied. Control continues at 378, where control calculates overpotential as the maximum voltage value minus the measured OCV. Control continues at 380, where control applies a filter to the slope of the overpotential (that is, the difference between the present overpotential and the prior overpotential). For example, the filter may be an exponentially weighted moving average.

Control continues at 382, where control determines whether the Cycle_Count variable is greater than a threshold. If so, control transfers to 384; otherwise, control transfers to 376. The threshold may be set such that a reliable value of the filtered slope can be determined. In other words, the readings of overpotential for the first few cycles may not be reliable until the filter can catch up to the slope.

At 384, control determines whether the Plateau_Flag has been set. If so, control transfers to 386; otherwise, control transfers to 388. At 388, the Plateau_Flag has not been set and therefore control attempts to determine whether the plateau regime of overpotential has been reached. Therefore, if the filtered slope is less than the plateau threshold, indicating a relatively flat overpotential, control transfers to 390; otherwise, control transfers to 376. At 390, control sets the Plateau_Flag and continues at 376.

At 386, the Plateau_Flag has already been set, indicating that the plateau regime of overpotential has been reached. If the filtered slope now increases significantly, control can infer the onset of rapid capacity decay. Therefore, if, at 386, the filtered slope is greater than the upswing threshold, control transfers to 392; otherwise, control transfers to 376.

At 392, control decreases the maximum voltage value. For example, control may set the maximum voltage value to the predetermined maximum value minus the measured overpotential. Control then continues at 376. In various implementations, instead of subtracting the current measured overpotential from the predetermined maximum value, control may subtract a quantity from the predetermined maximum value. The quantity may be the difference between the currently measured overpotential and the measured overpotential of the new battery (for example, within one of the first few battery cycles).

At 376, control determines whether the battery has been discharged. If so, control transfers to 394; otherwise, control remains at 376. Whether the battery has been discharged may be determined based on a signal from the battery charging system or based on a voltage of the battery decreasing by a certain amount. The certain amount may be related to a state of charge of the battery or to a predetermined voltage value. At 394, the battery has now discharged from full charge and therefore the Cycle_Count variable is incremented. Control then returns to 350.

In FIG. 4A, a plot includes a trace 400 for measured OCV, a trace 404 for positive OCV, and a trace 408 for negative OCV of a battery over a fifth battery cycle. In various implementations, the stoichiometric fit module, from FIG. 2, outputs the positive OCV trace 404 and the negative OCV trace 408. For FIGS. 4A-4C, the x-axis depicts a state of charge (SOC) of the battery being measured. As the SOC of the battery reaches zero, the measured OCV trace 400 and the positive OCV trace 404 decrease as well. A cathode voltage level in volts is depicted on the left y-axis, showing a range of 2.8 volts to 4.4 volts. For the measured OCV trace 400 and the positive OCV trace 404, the left y-axis indicates a voltage level, in volts, of the measured OCV and the positive OCV. On the right y-axis, an anode voltage level ranges from 0 volts to 0.8 volts. For the negative OCV trace 408, the right y-axis indicates a voltage level, in volts, of the negative OCV. As the SOC of the battery decreases, the negative OCV increases.

The negative OCV trace 408 begins at a first plateau 412 near 0.1 V when the battery is fully charged, where a state of charge (SOC) trace 416 is equal to 1 (that is, 100% charged). As the SOC of the battery decreases, the negative OCV trace 408 reaches a second plateau 420 (when the SOC is near 60% charge). FIG. 4A depicts the measured cell OCV and the estimated positive and negative OCVs during the fifth cycle. Since the negative OCV has not shifted to the second plateau 420 when the battery is fully charged, the maximum voltage should remain unchanged as the measured OCV trace 400 does not indicate that the battery has begun rapid cell capacity decline.

Referring to FIG. 4B, a plot includes a trace 424 for measured OCV, a trace 428 for positive OCV, and a trace 432 for negative OCV of a battery during a 6160th battery cycle. The negative OCV trace 432 depicts a first plateau 436 and a second plateau 440. A line 444 at SOC=1 shows that the negative OCV of a fully charged battery remains at the first plateau 436 when the battery has experienced 6160 cycles. However, the second plateau 440 is closer to the line 444 during the 6160th cycle of the battery in comparison to the fifth cycle of the battery shown in FIG. 4A.

Referring to FIG. 4C, a plot includes a trace 448 for measured OCV, a trace 452 for positive OCV, and a trace 456 for negative OCV of a battery during a 6679th battery cycle. The negative OCV trace 456 includes a first plateau 460 and a second plateau 464. A line 468 at SOC=1 shows that a negative OCV of the battery when the battery is fully charged is within the second plateau 464. Therefore, when the battery has reached the 6679th cycle, the battery is exhibiting behavior that indicates an onset of rapid cell capacity loss, as shown in FIGS. 5 and 6A-6B. Therefore, as described above, the maximum voltage of the battery may be adjusted to accommodate for the shift in negative OCV. In various implementations, the adjustment to the maximum voltage of the battery charge may be equal to the difference between the first plateau 460 and the second plateau 464. That is, the battery would be considered fully charged once the battery reaches a value equal to the maximum voltage less the difference between the first plateau 460 and the second plateau 464.

Referring to FIG. 5, a graphical depiction of changes to cell capacity and full charge negative OCV over a battery lifetime is shown. A trace 500 for cell capacity shows the cell capacity lowers over the lifetime of the battery. A negative OCV trace shows a first plateau 504 and a second plateau 508 over the lifetime of the battery. Notably, around 6500 cycles, the negative OCV of the fully charged battery begins to shift from the first plateau 504 to the second plateau 508. Around the same cycle, the cell capacity trace 500 also lowers at a faster rate, showing capacity roll-over, suggesting the battery may be entering rapid cell capacity loss. When the negative OCV begins to shift to the second plateau 508, the maximum voltage of the battery may be lowered by the amount of the shift to slow the onset of rapid cell capacity loss.

Referring to FIG. 6A, a graphical depiction of changes over a battery lifetime to cell capacity and cell overpotential measured after a one-hour rest period is shown. Once the battery is fully charged, the cell capacity and cell overpotential are measured after the battery rests for the one-hour period. A trace 600 for the cell capacity depicts capacity roll-over around 6000 cycles, similar to the capacity roll-over shown in FIG. 5. Further, a trace 604 for the cell overpotential shows changes in the cell overpotential of the battery. As described above, once the battery is fully charged, the OCV may be measured immediately and then again after a predetermined period. The cell overpotential may be calculated as a difference between the maximum charging voltage and the measured OCV.

The cell overpotential trace 604 shows the cell overpotential plateauing around 6000 cycles and then increasing rapidly. Therefore, the cell overpotential changes are identifiable and a maximum voltage of the battery can be lowered when the cell overpotential or the cell capacity indicates the battery may soon enter rapid cell capacity loss. Rapid cell capacity loss shortens the lifetime of the battery.

FIG. 6B is a graphical depiction of changes over a battery lifetime to cell capacity and cell overpotential measured after a one-minute rest period. Once the battery is fully charged, the cell capacity and cell overpotential are measured after the battery rests for the one-minute period. A trace 608 for the cell capacity depicts cell capacity roll-over occurring around 6000 cycles. Similarly, around 6000 cycles, a trace 612 for the cell overpotential shows the cell overpotential plateau and then a rapid increase in subsequent cycles. In FIG. 6B, the rest period or the predetermined period before determining the cell overpotential is one minute. Therefore, the plateau effect occurring with the cell overpotential value is observed using both the predetermined period of one hour and one minute.

FIG. 7 is a graphical depiction of changes to cell capacity, cell overpotential, and negative OCV over a battery lifetime. A trace 700 for the cell capacity shows capacity roll-over occurring around 6000 cycles. A trace 704 for the negative OCV shows a shift from a first plateau to a second plateau occurring around 6000 cycles as well. Similarly, a trace 708 for the cell overpotential plateaus and then begins to rapidly increase around the same cycle as when the negative OCV trace 704 shifts and the capacity roll-over of the cell capacity trace 700 occurs. In various implementations, a present slope of the cell overpotential may be compared to a threshold slope to identify rapid changes to cell overpotential and determine when the battery may be entering rapid cell capacity loss. These changes occurring around the same cycle indicates that the cell overpotential and the negative OCV of the measured OCV can be used to identify when the battery may begin to enter rapid cell capacity loss. Rapid cell capacity loss can be mitigated by adjusting a maximum voltage of the battery.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C." The term subset does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuit(s) may implement wired or wireless interfaces that connect to a controller area network (CAN) or a wireless personal area network (WPAN). The module may communicate with other modules using the interface circuit(s). Although the module may be depicted in the present disclosure as logically communicating directly with other modules, in various implementations the module may actually communicate via a communications system.

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

The invention claimed is:

1. A battery control system for a vehicle, the battery control system comprising:
a battery state estimator configured to obtain a battery cell open circuit voltage (OCV) of a battery in response to a charging system charging the battery to a maximum charging voltage;

an overpotential identification module configured to obtain an OCV of the battery a predetermined period after the charging system charges the battery to the maximum charging voltage;

a negative voltage determination module configured to determine a negative OCV of the battery based on the obtained battery cell OCV;

a cell overpotential change determination module configured to:
determine a cell overpotential of the battery based on the obtained OCV; and
determine a slope of the cell overpotential using the cell overpotential of the battery and a previous cell overpotential of the battery;

a voltage shift determination module configured to identify a difference between the negative OCV of the battery and a previous negative OCV of the battery; and a charge voltage module configured to:
selectively reduce the maximum charging voltage to a reduced maximum charging voltage based on at least one of: (i) the difference and (ii) the slope; and
transmit the reduced maximum charging voltage to the charging system,
wherein the charging system is instructed to charge the battery such that the battery does not exceed the reduced maximum charging voltage.

2. The battery control system of claim 1 wherein the battery state estimator is configured to store the obtained battery cell OCV of the battery in response to the obtained battery cell OCV being measured the predetermined period after the charging system charges the battery to the maximum charging voltage.

3. The battery control system of claim 1 further comprising a voltage sensor configured to measure a voltage of the battery, wherein the charging system receives a measured voltage from the voltage sensor and reduces a charging current supplied to the battery in response to the measured voltage from the voltage sensor reaching at least one of: (i) the maximum charging voltage and (ii) a reduced maximum voltage.

4. The battery control system of claim 1 wherein the charging voltage module is configured to selectively reduce the maximum charging voltage by the determined cell overpotential or an amount based on the determined cell overpotential.

5. The battery control system of claim 1 wherein the battery state estimator is configured to obtain the OCV of the battery the predetermined period following the battery reaching full charge or the maximum charging voltage.

6. The battery control system of claim 5 wherein the battery is under zero load during the predetermined period.

7. A vehicle comprising:
the battery control system of claim 1; and
a display, wherein the voltage shift determination module transmits a cell capacity alert to the display, and wherein, in response to receiving the cell capacity alert, the display produces at least one of: a visual alert, an audible alert, and a haptic feedback alert.

8. The battery control system of claim 1 wherein the maximum charging voltage is reduced by an amount based on the difference between the negative OCV of the battery and the previous negative OCV of the battery.

9. The battery control system of claim 8 further comprising a negative OCV history, wherein the previous negative OCV of the battery is an original negative OCV of the battery included in the negative OCV history.

10. The battery control system of claim 1 wherein the charge voltage module selectively reduces the maximum charging voltage of the battery in response to the difference exceeding a threshold value.

11. The battery control system of claim 10 wherein the charge voltage module sets the previous negative OCV of the battery equal to the negative OCV of the battery.

12. A battery control system for a vehicle, the battery control system comprising:
an overpotential identification module configured to obtain an open circuit voltage (OCV) of a battery a predetermined period after a charging system charges the battery to a maximum charging voltage;
a cell overpotential change determination module configured to determine a cell overpotential of the battery based on the obtained OCV;
a voltage shift determination module configured to determine a slope of the cell overpotential using the cell overpotential of the battery and a previous cell overpotential of the battery; and
a charge voltage module configured to selectively reduce the maximum charging voltage to a reduced maximum charging voltage based on the slope and transmit the reduced maximum charging voltage to the charging system, wherein the charging system is instructed to charge the battery such that the battery does not exceed the reduced maximum charging voltage.

13. The battery control system of claim 12 wherein the overpotential identification module includes a voltage sensor configured to measure the OCV across terminals of the battery.

14. A battery control method for a vehicle, the battery control method comprising:
obtaining an open circuit voltage (OCV) of a battery in response to charging the battery to a maximum charging voltage;
obtaining an OCV of the battery a predetermined period in response to charging the battery to the maximum charging voltage;
determining a negative OCV of the battery based on the obtained OCV;
identifying a difference between the negative OCV of the battery and a previous negative OCV of the battery;
determining a cell overpotential of the battery based on the obtained OCV;
determining a slope of the cell overpotential using the cell overpotential of the battery and a previous cell overpotential of the battery;
selectively reducing the maximum charging voltage to a reduced maximum charging voltage based on at least one of: (i) the difference and (ii) the slope;
transmitting the reduced maximum charging voltage to a charging system; and
instructing the charging system to charge the battery such that the battery does not exceed the reduced maximum charging voltage.

15. The battery control method of claim 14 further comprising selectively reducing the maximum charging voltage by an amount based on the cell overpotential.

16. The battery control method of claim 14 wherein the obtaining the OCV of the battery occurs while the battery is under zero load.

17. The battery control method of claim 14 wherein the maximum charging voltage is reduced by an amount based on the difference between the negative OCV of the battery and the previous negative OCV of the battery.

18. The battery control method of claim 14 wherein the maximum charging voltage of the battery is selectively reduced in response to the difference exceeding a threshold value.

\* \* \* \* \*